July 3, 1962 E. H. CUMPSTON, JR 3,042,741
ELECTRIC CIRCUIT BOARD
Filed May 29, 1959
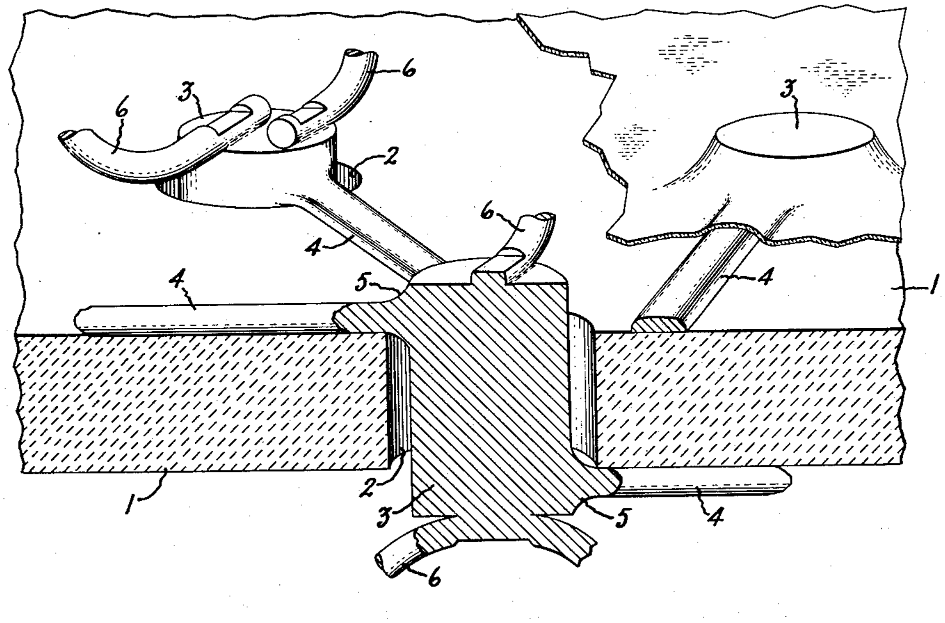
Inventor:
Edward H. Cumpston, Jr.,
by Paul A. Frank
His Attorney.

United States Patent Office 3,042,741
Patented July 3, 1962

3,042,741
ELECTRIC CIRCUIT BOARD

Edward H. Cumpston, Jr., Schenectady, N.Y., assignor to General Electric Company, a corporation of New York Filed May 29, 1959, Ser. No. 816,816
6 Claims. (Cl. 174—68.5)

My invention relates to electric circuit boards and to methods of making the same.

As we become more and more dependent upon electric and electronic circuits, we find that the reliability of such equipments is no greater than, and is utterly dependent upon, the electrical connections themselves. As the result of faulty electrical connections, a manufacturer many times finds that his product is injured and the user of the product discovers that not only is his use and enjoyment of the product decreased, but many times his very safety is threatened. In the past, many attempts have been made to improve electrical connections, such as by dip soldering, welding, crimping, clamping, and the like. However, such connections often have been found faulty when subjected to age and vibration, rough usage, thermal and physical shocks, or to adverse environments such as moisture, salt spray, or gas fumes.

While printed circuits offer many desirable features to a manufacturer, thermal characteristics of the plastic material upon which the printed circuit is mounted proves a limitation which prevents use of manufacturing processes which might secure more reliable connections.

It is an object of my invention to provide a new and improved electric circuit board which permits a manufacturer greater freedom in designing circuits and in using high temperature manufacturing processes, such as welding, brazing, and the like.

It is another object of my invention to provide a new and improved electric circuit board which will withstand thermal mechanical shocks as well as adverse environmental conditions.

One of the limitations encountered in the use of printed circuits is the necessity for mounting all circuit components upon one side of the circuit board. This is partially due to the fact that the plastic material has a high coefficient of thermal expansion which tends to break connections extending through the circuit board when the board is subjected to varying temperatures. It is also obvious that, if components are mounted on both sides of an electric circuit board, dip soldering and similar techniques cannot be employed for making connections to more than one side.

Accordingly, it is another object of my invention to provide a new and improved electric circuit board having reliable electrical connections which extend through the board and which permit mounting of circuit components on both sides, thus reducing the space requirements of the complete apparatus.

One of the principal features of my invention consists of forming an electric circuit board out of a sheet of inorganic dielectric material which may be subjected to very high temperatures, placing metal pins within apertures in such material, applying an electric circuitry to the sheet and to the metal pins in a semi-solid or paste-like state and heating the sheet, pins, and circuitry to a temperature sufficiently high that the circuitry is fused to the sheet and to the pins.

Another feature of my invention consists of applying a protective coating over the finished board and circuitry to prevent deterioration or short circuiting when the circuit board is subjected to moisture, salt spray, gas fumes, and similar atmospheres.

The novel features which I believe to be characteristic of my invention are set forth with particularity in the appended claims. My invention itself, however, may best be understood by reference to the following description taken in connection with the accompanying drawing, the single FIGURE of which is a perspective view of a portion of an electric circuit board constructed according to my invention.

In the drawing, the electric circuit board comprises a sheet 1 of inorganic dielectric material which preferably has a very high melting point and which may comprise, for example, alumina or any other similar suitable ceramic material. Other suitable materials are, for example, steatite and forsterite. The sheet 1 is provided with a plurality of apertures 2 extending completely through the sheet and in which are located metal pins 3 composed of a suitable low resistivity material, such as nickel-iron alloy. While the pins 3 are illustrated as being solid, they may be in the form of hollow tubes. In either event, the pins should extend sufficiently beyond the surfaces of the board so that their ends are readily accessible for joining electric components thereto. Also, it is desirable that the pins be of sufficient size that they act as a heat sink, particularly when welded connections are made, to prevent heat damage to the components.

In accordance with my invention also, I provide circuitry comprising a plurality of conductive paths or connections which are reliably attached both to the pins 3 and the sheet 1, the circuitry being connected to the pins and to the sheet by welding or fusing thereto. By the term "circuitry" is meant a low resistivity path for an electric current. The circuitry, or connections 4, is deposited on the surface of the sheet 1 in a desired configuration and in contact with desired pins 3. Preferably the circuitry is deposited as a semi-solid or paste which is nonflowing and is subsequently bonded or fused to the sheet 1 by a suitable glass which melts during a heating process to be described later.

One desirable circuitry material comprises a mixture which consists of 40% copper powder, 20% nickel powder, 18% cuprous oxide powder, 18% high temperature glass frit, and approximately 4% sodium silicate in water solution. The powders are mixed with sufficient water to a desired consistency for application as a paste or semi-solid, nonflowing material to the sheet 1.

Another suitable composition for the circuitry is one in which iron powder is substituted for the nickel powder of the above formulation, silver for the copper powder, and colloidal silica for the glass frit. Thus, a mixture using such alternative components would comprise silver plus colloidal silica, plus iron oxide ($Fe_2O_3$), plus copper oxide ($Cu_2O$).

In constructing the electric circuit board of my invention, I find it convenient to deposit the circuitry as a paste according to the desired configuration and then insert the pins 3 in the apertures 2, the apertures being sufficiently large that the pins fit loosely therein and are held in place by the circuitry to provide room for the formation of generous sized fillets 5 at the junction points. Where a given pin 3 is not to be joined to others, short lengths of dummy circuitry may be employed at one end of the pin to provide support for the pin within its aperture 2.

After the circuit and pins have been assembled according to the desired configuration, the assembled sheet is placed within a furnace and heated to fusion or welding temperature. For the first of the circuitry materials mentioned above, such temperature may suitably be 2100° F. If silver is employed in the circuitry material, the temperature of the furnace may be reduced to approximately 1900° F. Also, I have found that if a wet hydrogen atmosphere is employed in the furnace, oxidation of the metals is prevented. At the temperatures mentioned above, the glass frit melts and bonds with the inorganic or ceramic sheet 1 and the cuprous oxide to mechanically grip the nickel powder. At the same time, the copper or silver melts and alloys with the pins and the nickel or iron powder. I have found that when nickel or iron powder is employed, such powder does not melt and so prevents undesired flow of the molten copper and movement of the pins during the firing process.

I have further found that if the paste-like material is applied to the board as a layer sufficiently thick that after firing the circuitry is 0.008 inch thick, an excellent electrical connection between pins is obtained.

In selecting both the material for the sheet 1 and the pins 3, it is desirable to employ materials which have similar coefficients of expansion, thus preventing relative motion of the parts during temperature changes of the circuit board in use. The coefficient of the circuitry is not important since it is tightly bonded to the sheet.

After the circuitry has been fused to the sheet 1 and pins 3, it may be desirable to provide a protective coating for the circuitry, particularly if the circuit board is to be employed under adverse environmental conditions. Such a protective coating may take the form of a suitable glass coating which can be sprayed on the assembled board and fired. Again, in choosing any such glass or protective coating, it is desirable that its coefficient of expansion be matched to that of the sheet 1 to prevent crazing during cooling. Such coatings preferably are applied to the board by firing in an air atmosphere at a temperature of the order of 1600° F. and below the melting point of the material of the circuitry 4.

After the board has been completed in accordance with the steps outlined above, the protective coating may be easily removed from the ends of the connection pins 3 by grinding since the pin ends are raised above the sheet and circuitry. Thereafter the leads 6 of components to be joined to the board may be connected to the pins 3 by any suitable connection method, such as welding, brazing, soldering, and the like. Preferably, pins 3 are of a diameter such that multiple component connections may be made at either or both ends of a pin. In particular, I have found that when components are resistance welded to the pins 3, an extremely short period of time is required and the amount of heat required is not sufficient to adversely affect either the sheet 1, the material of circuitry 4, or the components.

As an alternative to using the adhesive material in the circuitry material mentioned previously, I have found that if glycerin is applied to the board according to the configuration desired for the conductive connection between pins, the sodium silicate and water may be omitted. In such case, the metal powders and cuprous oxide powder may be dusted on the glycerin to a desired thickness. When the ceramic board is subsequently fired, the glycerin is burned and a highly conductive connection is obtained between pins 3 in the manner discussed previously.

One of the advantages of my improved electric circuit board is that it provides an arrangement in which the electric circuitry is firmly affixed to the board and to the through connection pins 3. In this manner, the connections are found to be less subject to physical disturbances, fatigue, shock, or corrosion.

While I have shown and described particular embodiments of my invention, it will, of course, be understood that I do not wish to be limited thereto since various changes and modifications may be made without departing from my invention, and I contemplate by the appended claims to cover all such changes and modifications as fall within the true spirit and scope of my invention.

What I claim as new and desire to secure by Letters Patent of the United States is:

1. An electric circuit board comprising a sheet of inorganic dielectric material having a plurality of apertures therethrough, electrically conductive pins positioned in desired ones of said apertures, and electric circuitry fused to both the outer surface of said sheet and the sides of desired ones of said pins, said pins being of sufficient length to extend beyond the surface of the sheet and the circuitry, and a lead for a component connected to said board welded to the end of one of said pins.

2. An electric circuit board as set forth in claim 1 in which the circuitry has a thickness of at least 0.008 inch.

3. An electric circuit board comprising a sheet of ceramic material having apertures therethrough at desired connection points, metal pins positioned in said holes, said pins being of length sufficient to extend beyond the surfaces of said sheet on both sides thereof, conductive connections fused to both said sheet and the sides of desired ones of said pins, and leads for electric circuit components welded to the ends of selected ones of said pins.

4. An electric circuit board as set forth in claim 3 in which a protective coating covers the sheet, the conductive connections, and all but the ends of the pins.

5. An electric circuit board as set forth in claim 3 in which the metal pins are solid and comprise a nickel-iron alloy.

6. An electric circuit board as set forth in claim 3 in which the ceramic material comprises alumina.

References Cited in the file of this patent

UNITED STATES PATENTS

| | | |
|---|---|---|
| 2,066,511 | Arlt | Jan. 5, 1937 |
| 2,244,009 | Hiensch et al. | June 3, 1941 |
| 2,456,313 | Pratt | Dec. 14, 1948 |
| 2,557,983 | Linder | June 26, 1951 |
| 2,699,424 | Nieter | Jan. 11, 1955 |
| 2,756,485 | Abramson et al. | July 31, 1956 |
| 2,771,663 | Henry | Nov. 27, 1956 |
| 2,777,192 | Albright et al. | Jan. 15, 1957 |

FOREIGN PATENTS

| | | |
|---|---|---|
| 649,254 | Great Britain | Jan. 24, 1951 |

OTHER REFERENCES

Publication I: "Metallized Circuits" (Collier), published in Product Engineering, April 1948 (pages 141–143 relied on).

Publication II: "Ceramics in Electronic Design" (Lazarkis), published in Electronic Design, Nov. 1, 1956 (pages 21–23 relied on).